US012491542B2

(12) United States Patent
Ho et al.

(10) Patent No.: US 12,491,542 B2

(45) **Date of Patent: *Dec. 9, 2025**

(54) METHODS FOR CLEANING THE PULL CABLE OF AN INGOT PULLER APPARATUS

(71) Applicant: GlobalWafers Co., Ltd., Hsinchu (TW)

(72) Inventors: Chin-Hung Ho, Hsinchu (TW); Chih-Kai Cheng, Zhubei (TW); Chen-Yi Lin, Jhunan Township (TW); Feng-Chien Tsai, Zhubei (TW); Tung-Hsiao Li, Toufen (TW); YoungGil Jeong, St. Peters, MO (US); Jin Yong Uhm, Lewisville, TX (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/999,892

(22) Filed: Dec. 23, 2024

(65) Prior Publication Data

US 2025/0121415 A1 Apr. 17, 2025

Related U.S. Application Data

(62) Division of application No. 18/300,850, filed on Apr. 14, 2023, now Pat. No. 12,202,017.

(Continued)

(51) Int. Cl.

| | |
|---|---|
| ***B08B 5/02*** | (2006.01) |
| ***B08B 9/28*** | (2006.01) |
| ***B08B 9/34*** | (2006.01) |
| ***C30B 15/00*** | (2006.01) |
| ***C30B 15/30*** | (2006.01) |
| ***C30B 29/06*** | (2006.01) |
| ***C30B 35/00*** | (2006.01) |

(52) U.S. Cl.

CPC ................ *B08B 5/02* (2013.01); *C30B 15/30* (2013.01); *C30B 29/06* (2013.01); *B08B 9/28* (2013.01); *B08B 9/34* (2013.01); *C30B 15/00* (2013.01); *C30B 35/00* (2013.01)

(58) Field of Classification Search

CPC ......... C30B 15/30; C30B 29/06; C30B 15/00; C30B 35/00; B08B 5/02; B08B 9/34; B08B 9/28

See application file for complete search history.

(56) References Cited

U.S. PATENT DOCUMENTS

| | | | |
|---|---|---|---|
| 2,975,036 | A | 3/1961 | Edwin et al. |
| 10,000,863 | B2 | 6/2018 | Okita |

(Continued)

FOREIGN PATENT DOCUMENTS

| | | | |
|---|---|---|---|
| CN | 209779039 | U | 12/2019 |
| JP | 2001089295 | A | 4/2001 |

(Continued)

*Primary Examiner* — Benjamin L Osterhout

(74) *Attorney, Agent, or Firm* — Armstrong Teasdale LLP

(57) ABSTRACT

Cleaning tools for cleaning the pull cable of an ingot puller apparatus and methods for cleaning the pull cable are disclosed. The cleaning tool includes a chamber for receiving the pull cable. Pressurized fluid is discharged through one or more nozzles to detach debris from the pull cable. The fluid and debris are collected in an exhaust plenum of the cleaning tool and are expelled through an exhaust tube. The cleaning tool includes one or more guides that guide the cleaning tool in an upper segment of the ingot puller apparatus.

9 Claims, 8 Drawing Sheets

Related U.S. Application Data

(60) Provisional application No. 63/335,447, filed on Apr. 27, 2022.

(56) References Cited

U.S. PATENT DOCUMENTS

| | | | |
|---|---|---|---|
| 12,202,017 | B2 | 1/2025 | Ho et al. |
| 2019/0388943 | A1 | 12/2019 | Okita |
| 2020/0001335 | A1 | 1/2020 | Okita |

FOREIGN PATENT DOCUMENTS

| | | | |
|---|---|---|---|
| JP | 2001348293 | A | 12/2001 |
| JP | 2001348295 | A | 12/2001 |
| JP | 2010013305 | A | 1/2010 |
| JP | 2011032142 | A | 2/2011 |
| JP | 2013147406 | A | 8/2013 |
| JP | 2017109882 | A | 6/2017 |
| TW | 201245517 | A | 11/2012 |

METHODS FOR CLEANING THE PULL CABLE OF AN INGOT PULLER APPARATUS

CROSS-REFERENCE TO RELATED APPLICATIONS

This application is a Divisional of U.S. Non-provisional patent application Ser. No. 18/300,850, filed Apr. 14, 2023, which claims the benefit of U.S. Provisional Patent Application No. 63/335,447, filed Apr. 27, 2022. Both applications are incorporated herein by reference it their entirety.

FIELD OF THE DISCLOSURE

The field of the disclosure relates to cleaning tools for cleaning the pull cable of an ingot puller apparatus and relates to methods for cleaning the pull cable of an ingot puller apparatus.

BACKGROUND

Single crystal silicon ingots may be grown by the so-called Czochralski process in which a silicon seed crystal is contacted with a melt of silicon. The silicon seed crystal is withdrawn from the melt causing a single crystal silicon ingot suspended by the seed crystal to form. The silicon seed crystal is secured to a seed chuck that is connected to a pull cable. The pull cable supports the chuck and seed crystal (and ingot during crystal growth). The pull cable is connected to a pulling mechanism which lowers and raises the pull cable within the ingot puller apparatus.

During ingot growth, silicon oxides may form in the melt. The silicon oxides are carried from the melt and deposit within the ingot puller apparatus including on the pull cable of the ingot puller apparatus. Other deposits such as carbon may be carried from the melt and may adhere to the pull cable. The deposits that form on the pull cable may fall from the pull cable during ingot growth which may result in loss of zero dislocation growth of the single crystal silicon ingot or cause defects to form in the ingot (e.g., slip or twin lamella). The silicon oxides may be removed from the pull cable periodically to prevent the oxides from falling into the melt. Cleaning operations which contact the pull cable may cause the cable to become damaged. The damaged cable could break during ingot growth causing the ingot to fall into the melt.

A need exists for tools and methods to clean the pull cable that are able to remove deposits from the pull cable and that do not result in the pull cable being damaged during the cleaning process.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a cleaning tool for cleaning a pull cable of an ingot puller apparatus. The cleaning tool includes a frame and a chamber that extends through the frame for receiving the pull cable. One or more nozzles direct a pressurized fluid at the pull cable. An exhaust flue carries away fluid discharged from the one or more nozzles.

Yet another aspect of the present disclosure is directed to a cleaning tool for cleaning a pull cable of an ingot puller apparatus. The cleaning tool includes a frame and a chamber that extends through the frame for receiving the pull cable. One or more nozzles direct a pressurized fluid toward the pull cable. The tool includes an extendable handle for raising and lowering the one or more nozzles into an upper chamber of the ingot puller apparatus.

A further aspect of the present disclosure is directed to a method for cleaning a pull cable of an ingot puller apparatus. The ingot puller apparatus includes a crystal puller housing that defines a growth chamber for pulling a silicon ingot from a silicon melt. The crystal puller housing includes a lower dome-shaped segment and an upper cylindrical-shaped segment that is removably connected to the lower dome-shaped segment. The pull cable is positioned within a chamber of a cleaning tool. Pressurized fluid is directed toward the pull cable. The pressurized fluid that is directed toward the pull cable is removed through an exhaust plenum of the cleaning tool for processing the pressurized fluid.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to cleaning tools for cleaning a pull cable of an ingot puller apparatus and to methods for cleaning a pull cable of an ingot puller apparatus. An example ingot puller apparatus (or more simply "ingot puller") having a pull cable is indicated generally as "100" in FIG. 1. The ingot puller apparatus 100 includes a crucible assembly 102 for holding a melt 104 of semiconductor or solar-grade material silicon. The crucible assembly 102 is supported by a susceptor 106.

Figure 2:
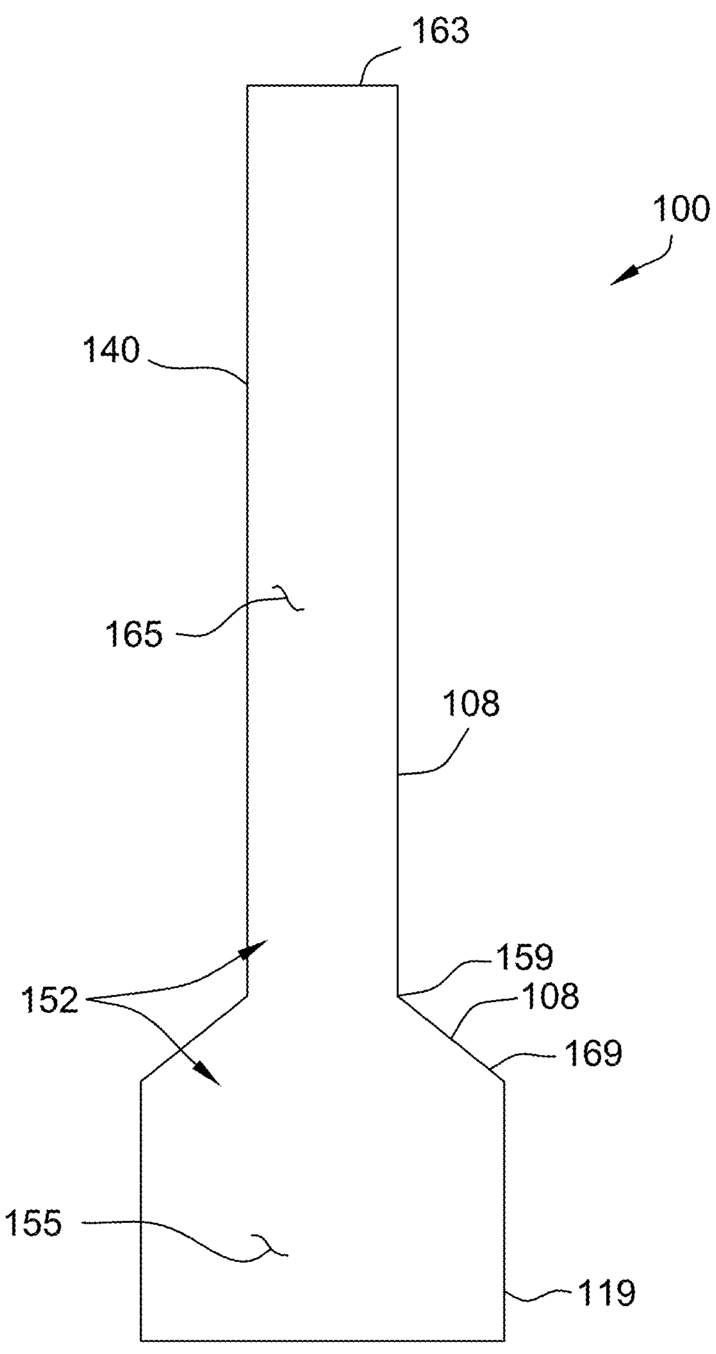
FIG. 2 is a schematic of an ingot puller apparatus having an upper segment and lower segment that is removably connected to the upper segment.

The ingot puller apparatus 100 includes a crystal puller housing 108 that defines a growth chamber 152 for pulling a silicon ingot from the silicon melt 104 along a pull axis A. Referring now to FIG. 2, the growth chamber 152 includes two portions—a lower growth chamber 155 (or simply "lower chamber") and an upper growth chamber 165 (or simply "upper chamber") disposed above the lower growth chamber 155. The hotzone of the ingot puller apparatus 100 (e.g., crucible, reflector, susceptor, heaters, and the like) is disposed within the lower chamber 155. During ingot growth, the ingot 113 is pulled through the lower chamber 155 and continues to be pulled through the upper chamber 165 as the ingot is lengthened.

The crystal puller housing 108 includes a domed lower segment 119 that defines the lower chamber 155 and an upper segment 140 that defines the upper chamber 165. The lower domed segment 119 includes a dome-shaped portion 169 which tapers in size to the diameter of the upper segment 140. The upper segment 140 is generally cylindrical in shape and includes a lower end 159 and an upper end 163. The upper segment 140 of the crystal puller housing 108 is removably connected to the lower segment 119 (e.g., by fasteners, gaskets or the like). For example, the lower segment 119 may be lowered away from the upper segment 140 to allow the cleaning tool 200 described below to be inserted into the upper segment 140 to clean the pull cable 118.

The crucible assembly 102 (FIG. 1) is disposed in the lower chamber 155. The crucible assembly 102 has a sidewall 131 and floor 129 and rests on a susceptor 106. The susceptor 106 is supported by a shaft 105. The susceptor 106, crucible assembly 102, shaft 105, and ingot 113 have a common longitudinal axis or "pull axis" A.

A pulling mechanism 114 is provided within the ingot puller apparatus 100 for growing and pulling an ingot 113 from the melt 104. The pulling mechanism 114 includes a pull cable 118, a seed holder or chuck 120 coupled to one end of the pull cable 118, and a seed crystal 122 coupled to the chuck 120 for initiating crystal growth. One end of the pull cable 118 is connected to a pulley (not shown) or a drum (not shown) of the pulling mechanism 114 and the other end is connected to the chuck 120 that holds the seed crystal 122. The pulling mechanism 114 includes a motor that rotates the pulley or drum.

In operation, the seed crystal 122 is lowered to contact the surface 111 of the melt 104. The pulling mechanism 114 is operated to cause the seed crystal 122 to rise. This causes a single crystal ingot 113 to be pulled from the melt 104.

During heating and crystal pulling, a crucible drive unit 107 (e.g., a motor) rotates the crucible assembly 102 and susceptor 106. A lift mechanism 112 raises and lowers the crucible assembly 102 along the pull axis A during the growth process. For example, the crucible assembly 102 may be at a lowest position (near the bottom heater 126) in which a charge of solid-phase silicon 133 previously added to the crucible assembly 102 is melted. Crystal growth commences by contacting the melt 104 with the seed crystal 122 and lifting the seed crystal 122 by the pulling mechanism 114.

A crystal drive unit (not shown) may also rotate the pulling cable 118 and ingot 113 in a direction opposite the direction in which the crucible drive unit 107 rotates the crucible assembly 102 (e.g., counter-rotation). In embodiments using iso-rotation, the crystal drive unit may rotate the pulling cable 118 in the same direction in which crucible drive unit rotates the crucible assembly 102.

The ingot puller apparatus 100 includes bottom insulation 110 and side insulation 124 to retain heat in the puller apparatus 100. In the illustrated embodiment, the ingot puller apparatus 100 includes a bottom heater 126 disposed below the crucible floor 129. The crucible assembly 102 may be moved to be in relatively close proximity to the bottom heater 126 to melt the solid silicon charged to the crucible assembly 102.

According to the Czochralski single crystal growth process, a quantity of solid-phase silicon such as polycrystalline silicon, or "polysilicon", is initially charged to the crucible assembly 102. The semiconductor or solar-grade solid silicon that is introduced into the crucible assembly 102 is melted by heat provided from one or more heating elements. Once the melt 104 is fully formed, the seed crystal 122 is lowered and contacted with the surface 111 of the melt 104. The pulling mechanism 114 is operated to pull the seed crystal 122 from the melt 104. The resulting ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104.

The crystal growth process may be a batch process in which solid silicon is initially added to the crucible assembly 102 to form a silicon melt without additional solid-silicon being added to the crucible assembly 102 during crystal growth. In other embodiments, the crystal growth process is a continuous Czochralski process in which an amount of silicon is added to the crucible assembly during ingot growth.

The ingot puller apparatus 100 includes a side heater 135 and a susceptor 106 that encircles the crucible assembly 102 to maintain the temperature of the melt 104 during crystal growth. The side heater 135 is disposed radially outward to the crucible sidewall 131 as the crucible assembly 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

The ingot puller apparatus 100 may include a heat shield 151. The heat shield 151 may shroud the ingot 113 and may be disposed within the crucible assembly 102 during crystal growth. The ingot puller apparatus 100 may include an inert gas system to introduce and withdraw an inert gas such as argon from the growth chamber 152.

The illustrated ingot puller apparatus 100 is an example and the cleaning tool 200 described below may generally be used to clean the pull cable 118 of any ingot puller apparatus that includes such a pull cable 118. The pull cable 118 may include a wire or a series of wires (e.g., twisted wires) that combine to form a cable. The pull cable 118 may be made of tungsten, such as twisted tungsten wires.

Figure 3:
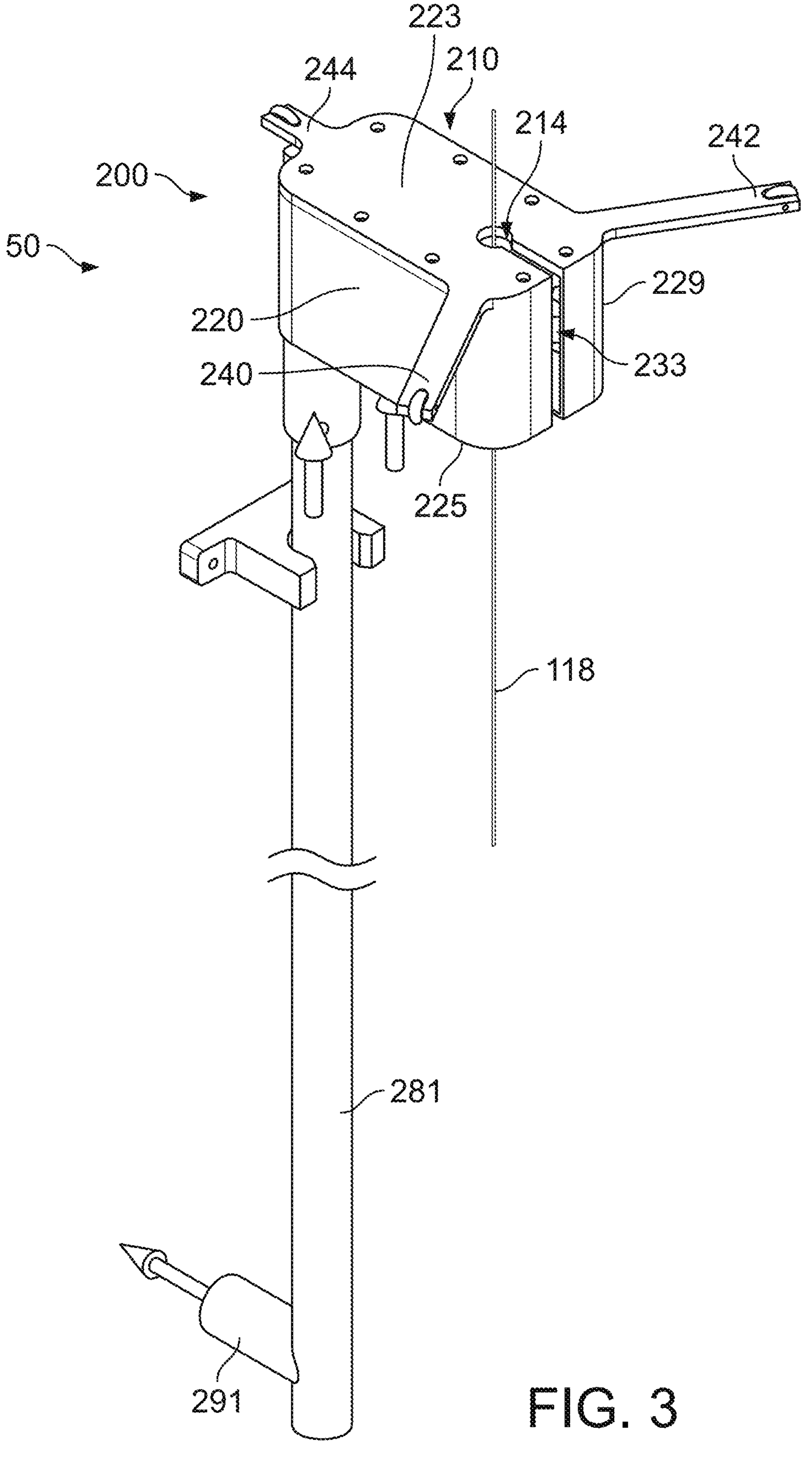
FIG. 3 is a perspective view of a cleaning tool for cleaning the pull cable of an ingot puller apparatus.

Referring now to FIG. 3, a cleaning tool for cleaning a pull cable of an ingot puller apparatus is indicated generally as "200". The cleaning tool 200 includes a frame 210 and a chamber 214 that extends through the frame 210 for receiving the pull cable 118. The frame 210 may generally be any structure which forms a chamber 214 in which the pull cable 118 is received. For example, the frame 210 could be a series of wires, cables, rods, plates or other frame members through which the pull cable 118 extends. In the illustrated embodiment, the frame 210 includes a main body 220. The main body 220 has a top 223 and a floor 225. One or more sidewalls 229 partially enclose the main body 220 circumferentially. The chamber 214 extends from the top 223 to the floor 225. A slot 233 extends through the one or more sidewalls 229 and through the top 223 and floor 225. The slot 233 provides an opening through which the pull cable 118 may pass through to receive the pull cable 118 in the chamber 214.

The cleaning tool 200 includes one or more outer guides 240, 242, 244 that guide the cleaning tool 200 within an upper chamber 165 (FIG. 2) of the ingot puller apparatus 100 during cleaning of the pull cable 118. In the illustrated embodiment, the one or more outer guides includes three guides—a first guide 240, a second guide 242, and a third guide 244. The guides 240, 242, 244 contact the inner surfaces of the upper chamber 165 and index the chamber 214 such that the chamber 214 is aligned with the pull cable 118. The outer guides 240, 242, 244 are disposed radially outward to the main body 220.

In the illustrated embodiment, the outer guides 240, 242, 244 are each an arm that extends radially outward from the main body 220. The outer guides 240, 242, 244 may have other shapes such as one or more rings that encircle the frame 210 (i.e., main body 220). In the illustrated embodiment, the one or more guides comprise three guides 240, 242, 244. Generally, any number of guides that allow the cleaning tool to function as described herein may be used unless stated otherwise.

Figure 7:
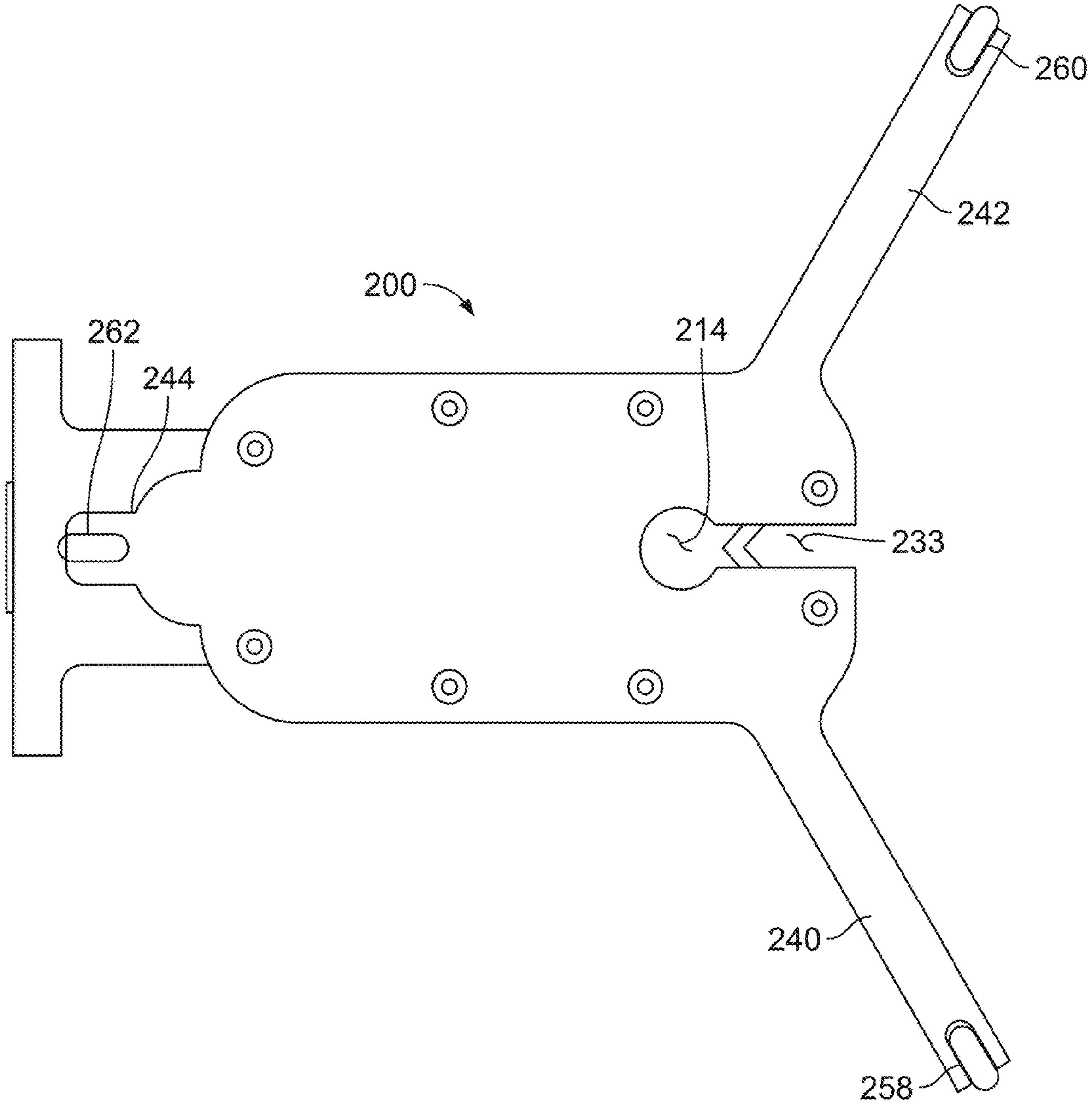
FIG. 7 is a top view of the cleaning tool.

Each guide 240, 242, 244 includes a roller wheel (or simply "roller") 258, 260, 262 (FIG. 7) at the distal end of the guide 240, 242, 244. Each roller 258, 260, 262 defines an arc of rotation that is perpendicular to the inner surface of the upper chamber 140 (FIG. 2) at the point at which the respective roller 258, 260, 262 contacts the inner surface of the upper chamber 165. The rollers 258, 260, 262 help move the cleaning tool 200 up and down the upper chamber 165 to clean the pull cable 118 while reducing or eliminating contact with the pull cable 118.

Figure 5:
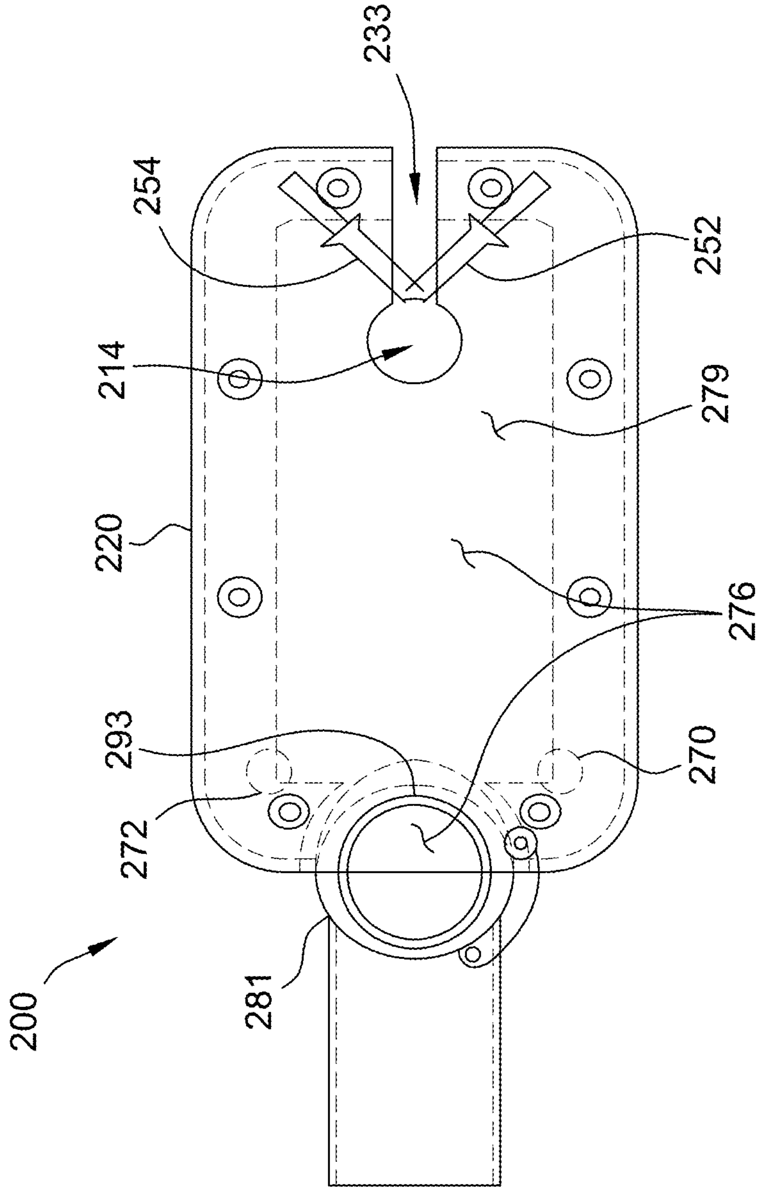
FIG. 5 is a top view of the main body of the cleaning tool.
Figure 6:
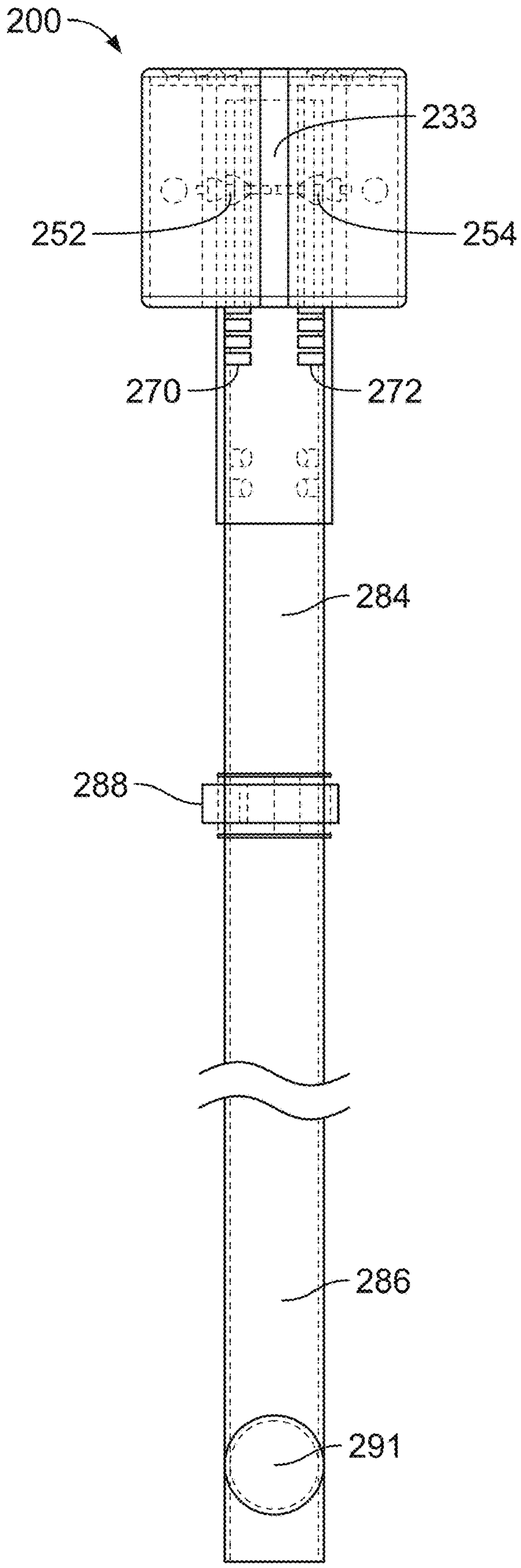
FIG. 6 is a front view of the cleaning tool.

Referring now to FIGS. 5-6, the cleaning tool 200 includes one or more nozzles 252, 254 for directing a pressurized fluid at the pull cable 118 (FIG. 3). Generally, any nozzle that directs pressurized fluid toward the pull cable 118 may be used (e.g., that increases the speed of the fluid). While a first nozzle 252 and second nozzle 254 are shown in the illustrated embodiment, in other embodiments a single nozzle or more than two nozzles may be used.

Figure 8:
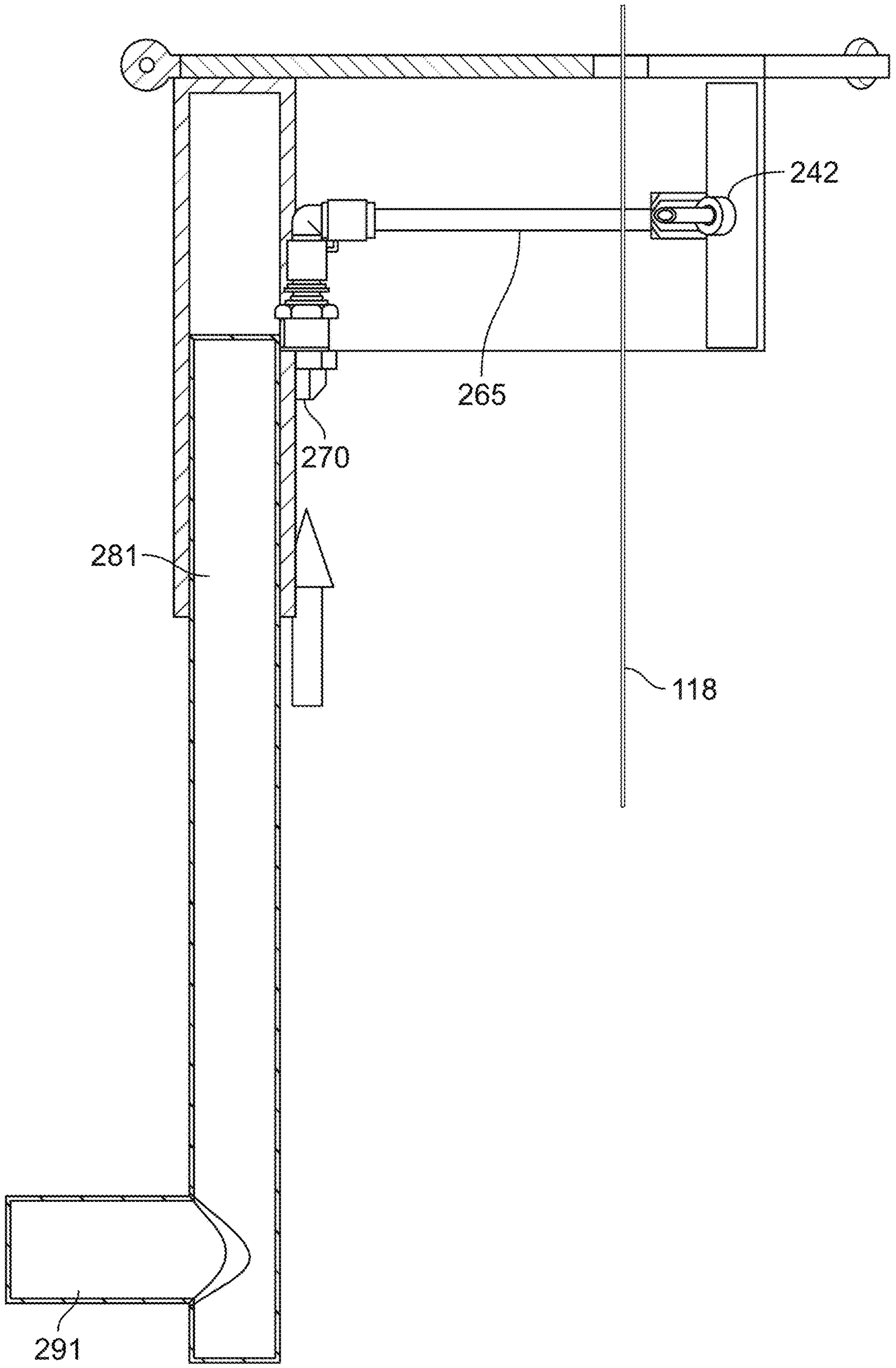
FIG. 8 is a side view of the cleaning tool.

Each nozzle 252, 254 is connected to a source of pressurized fluid (e.g., pressurized air or other gas such as argon or nitrogen) by conduits 265 (FIG. 8). The cleaning tool 200 may include ports 270, 272 (FIG. 6) to connect to the source of pressurized fluid. Pressurized fluid is directed toward the pull cable 118 through the nozzles 252, 254. The pressurized fluid may be controlled by valves in one or more supply conduits integrated into the source of pressurized fluid. After contact with the pull cable 118, the fluid enters an exhaust flue 276 (FIG. 5) which carries away the fluid. The exhaust flue 276 includes an exhaust plenum 279 within the main body 220 of the tool 200 and also includes an exhaust tube 281 that is in fluid communication with the exhaust plenum 279. The exhaust plenum 279 is defined by the top 223, floor 225, and one or more sidewalls 229 of the main body 220. The exhaust tube 281 is in fluid communication with the exhaust plenum 279 and extends downward from the main body 220.

Figure 4:
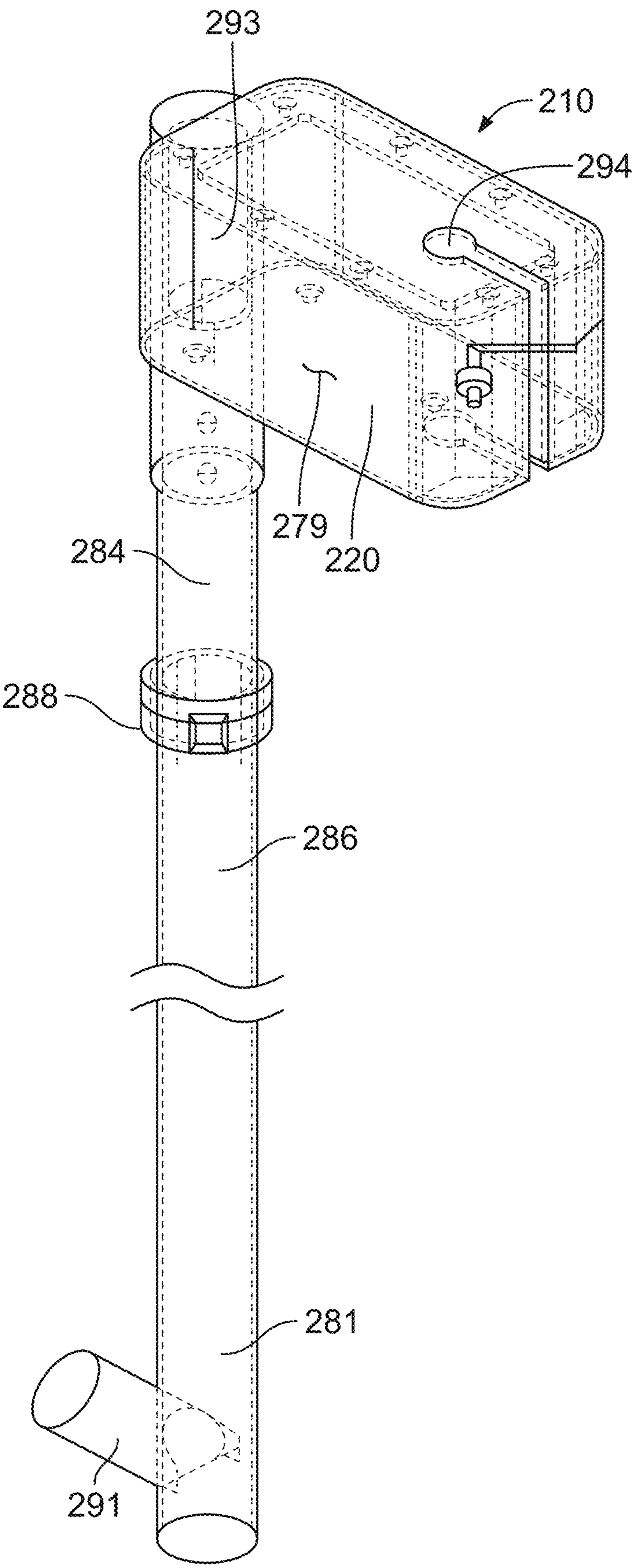
FIG. 4 is another perspective view of the cleaning tool without the guides being shown.

The exhaust tube 281 also may be used as a handle for raising and lowering the main body 220 within the upper chamber 165 (FIG. 2) of the ingot puller apparatus 100 (i.e., for raising and lowering the one or more nozzles 252, 254 relative to the pull cable 118). The handle 281 may be extendable. For example, the handle 281 may include a telescoping portion 284 (FIG. 4) that slides within an outer portion 286 to retract or extend the handle 281. The cleaning tool 200 may include a lock 288 to fix the telescoping portion 284 relative to the outer portion 286 (e.g., when positioning the tool 200 below the upper chamber 165 and inserting the pull cable 118 through the slot 233 (FIG. 3) into the chamber 214).

The exhaust tube 281 may be fluidly connected to one or more filters and/or a vacuum source such as by connection to the exhaust tube port 291. The exhaust tube 281 defines a fluid passageway that extends from its inlet 293 (FIG. 4) to the exhaust tube port 291.

The cleaning tool 200 is used to clean the ingot puller apparatus 100. Together the cleaning tool 200 and apparatus 100 may form part of an ingot puller system 50 for manufacturing a single crystal silicon ingot and for cleaning the system after use.

To clean the pull cable 118, the lower domed segment 119 of the crystal puller housing 108 is separated from the upper segment 140. The exhaust tube 281 is fluidly connected to the vacuum source (e.g., blower or pump which creates a vacuum). The fluid ports 270, 272 (FIG. 6) are connected to the source of pressurized fluid (e.g., pressurized air). The pull cable 118 is moved into a lowered position to allow access to the pull cable 118. The cleaning tool 200 is moved to position the pull cable 118 through the slot 233 and within the chamber 214 of the cleaning tool 200. The cleaning tool 200 is moved up and/or down relative to the pull cable 118 while pressurized fluid is directed toward the pull cable 118 through nozzles 252, 254 (i.e., from the lower end 159 toward the upper end 166 of the upper cylindrical segment 140). The cleaning tool 200 may be raised through the upper segment 140 of the ingot puller apparatus 100 by unlocking the lock 288 and extending the handle/exhaust tube 281. The guides 240, 242, 244 contact the inner surface of the upper segment 140 and assist to align the chamber 214 of the tool 200 with the pull cable 118. The guides 240, 242, 244 rotate as the tool 200 is moved up and down and ease movement of the tool 200 through the cylindrical upper segment 140.

As pressurized fluid is discharged from the first and second nozzles 252, 254, the fluid impacts the pull cable 118 causing debris and deposits to separate from the pull cable 118. The discharged fluid and debris material enters the exhaust plenum 279 within the main body 220 of the tool 200. The discharged fluid and debris is pulled within the exhaust tube 281 and is discharged through port 291 for further treatment (e.g., filtering).

The pull cable 118 may be cleaned after an ingot has been removed the ingot puller apparatus 100 and the ingot puller apparatus 100 has cooled to ambient temperature. In other embodiments, the pull cable is cleaned after a series of ingot runs.

Compared to conventional cleaning tools and methods, the cleaning tools and methods for cleaning the pull cable of the present disclosure have several advantages. The cleaning tool removes debris from the pull cable without the debris falling within the lower segment of the puller which is disposed below the upper segment and the pull cable. The debris material is instead pulled through the exhaust plenum and exhaust tube for further treatment. The guides of the cleaning tool allow the pull cable to be cleaned without the cleaning tool contacting the pull cable and possibly damaging the cable. Rollers disposed on the guides allow the cleaning tool to be more easily raised within the upper segment of the ingot puller. The extendable handle allows the cleaning tool to be moved up within the upper segment of the ingot puller and the lock allows the length of the upper segment to be fixed (e.g., when moving the cleaning tool to below the upper chamber or removing the tool from under the upper chamber after cleaning is finished). Use of two or more nozzles in the cleaning tool allows two of more sides of the cable to be cleaned simultaneously which increases the cleaning efficiency of the tool.

EXAMPLES

The processes of the present disclosure are further illustrated by the following Examples. These Examples should not be viewed in a limiting sense.

Example 1: Defect Rate in Ingot With and Without Use of the Cleaning Tool

Figure 1:
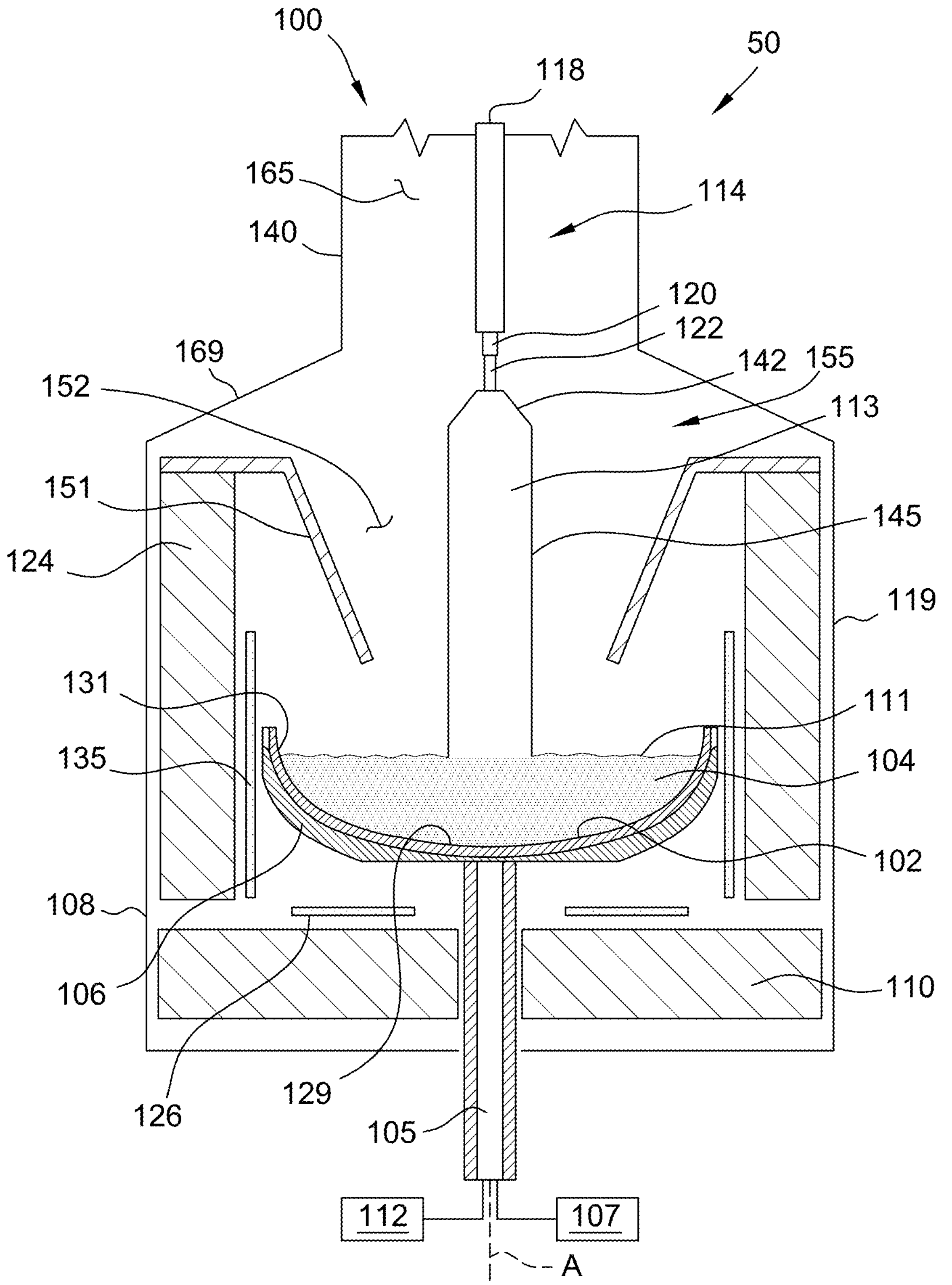
FIG. 1 is a cross-section of an ingot puller apparatus during ingot growth.

The cleaning tool shown in FIG. 3 was used to clean the pull cables of six ingot puller apparatus that were similar to the schematic apparatus of FIG. 1. The cleaning tool was used before growth of each ingot for a six month period. The rate at which twin/slips were observed in ingots in which the pull cable was cleaned prior to ingot growth was reduced from 1.0% to 0.3% compared to ingots in which the pull cable was not cleaned. Further, the crystal full bottom ratio (i.e., an entire crystal without dislocations in the main body formed) was improved from 77.7% to 84.55%.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for cleaning a pull cable of an ingot puller apparatus, the ingot puller apparatus comprising a crystal puller housing that defines a growth chamber for pulling a silicon ingot from a silicon melt, the crystal puller housing comprising a lower dome-shaped segment and an upper cylindrical-shaped segment that is removably connected to the lower dome-shaped segment, the method comprising:

separating the upper cylindrical-shaped segment from the lower dome-shaped segment;

positioning the pull cable within a chamber of a cleaning tool;

directing pressurized fluid toward the pull cable;

removing the pressurized fluid that is directed toward the pull cable through an exhaust plenum of the cleaning tool for processing the pressurized fluid;

moving the cleaning tool relative to the pull cable while directing pressurized fluid toward the pull cable and while removing the pressurized fluid through the exhaust plenum for processing the pressurized fluid; and moving the cleaning tool through the upper cylindrical-shaped segment of the ingot puller apparatus, the cleaning tool comprising one or more outer guides, the one or more outer guides guiding the cleaning tool within the upper cylindrical-shaped segment.

2. The method as set forth in claim 1 wherein the cleaning tool comprises a main body through which the chamber extends, the one or more outer guides being disposed radially outward from the main body.

3. The method as set forth in claim 2 wherein each of the one or more outer guides comprises a roller that contacts an inner surface of the upper cylindrical-shaped segment of the ingot puller apparatus.

4. The method as set forth in claim 1 wherein the cleaning tool comprises one or more nozzles that direct the pressurized fluid toward the pull cable.

5. The method as set forth in claim 4 wherein the one or more nozzles comprises a first nozzle and a second nozzle that direct the pressurized fluid toward the pull cable.

6. The method as set forth in claim 1 wherein the cleaning tool comprises:

a main body, the main body comprising a floor and a top, the chamber extending through the floor and the top, an exhaust flue for carrying away pressurized fluid that is directed toward the pull cable, the exhaust flue comprising:

the exhaust plenum; and an exhaust tube that extends from the main body, the exhaust tube being in fluid communication with the exhaust plenum; and wherein the pressurized fluid that is directed toward the pull cable is removed through the exhaust tube after passing through the exhaust plenum.

7. The method as set forth in claim 1 wherein moving the cleaning tool relative to the pull cable comprises extending an extendable handle of the cleaning tool.

8. The method as set forth in claim 7 wherein the extendable handle comprises an exhaust tube, pressurized fluid that is directed toward the pull cable being removed through an exhaust tube.

9. The method as set forth in claim 7 wherein moving the cleaning tool relative to the pull cable comprises extending a telescoping portion of the extendable handle.

* * * * *